US012765335B2

(12) United States Patent
Takeuchi et al.

(10) Patent No.: US 12,765,335 B2
(45) Date of Patent: Oct. 13, 2026

(54) METHOD FOR MAKING RADIO FREQUENCY SILICON-ON-INSULATOR (RFSOI) STRUCTURE INCLUDING A SUPERLATTICE

(71) Applicant: ATOMERA INCORPORATED, Los Gatos, CA (US)

(72) Inventors: Hideki Takeuchi, San Jose, CA (US); Susumu Kuwabara, Annaka City (JP)

(73) Assignee: ATOMERA INCORPORATED, Los Gatos, CA (US)

( * ) Notice: Subject to any disclaimer, the term of this patent is extended or adjusted under 35 U.S.C. 154(b) by 0 days.

(21) Appl. No.: 18/598,321

(22) Filed: Mar. 7, 2024

(65) Prior Publication Data

US 2024/0304493 A1 Sep. 12, 2024

Related U.S. Application Data

(60) Provisional application No. 63/512,130, filed on Jul. 6, 2023, provisional application No. 63/489,442, filed on Mar. 10, 2023.

(51) Int. Cl.
*H10P 90/00* (2026.01)
*H10D 62/815* (2025.01)
(Continued)

(52) U.S. Cl.
CPC ....... *H10P 90/1916* (2026.01); *H10D 62/815* (2025.01); *H10D 86/201* (2025.01); *H10W 10/181* (2026.01); *H10D 62/8181* (2025.01)

(58) Field of Classification Search
None
See application file for complete search history.

(56) References Cited

U.S. PATENT DOCUMENTS

| | | | | |
|---|---|---|---|---|
| 4,937,204 A | | 6/1990 | Ishibashi et al. | |
| 5,216,262 A | * | 6/1993 | Tsu ........................ | B82Y 10/00 257/17 |

(Continued)

FOREIGN PATENT DOCUMENTS

| | | | | |
|---|---|---|---|---|
| GB | 2347520 | 6/2000 | | |
| WO | 2008101232 | 8/2008 | | |
| WO | WO-2021092862 A1 * | 5/2021 | ............. | C30B 29/36 |

OTHER PUBLICATIONS

Translation of Huang, WO-2021092862-A1, 2021 (Year: 2021).*
(Continued)

*Primary Examiner* — William Henry Anderson
(74) *Attorney, Agent, or Firm* — ALLEN, DYER, DOPPELT, GILCHRIST, P.A. Attorneys at Law

(57) ABSTRACT

A semiconductor processing method may include forming a superlattice layer on a donor semiconductor wafer, the superlattice including a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions. The method may further include performing ion implantation on the donor semiconductor wafer to create a separation layer below the superlattice layer, forming an oxide layer on a base semiconductor wafer, performing ion beam treatment on the oxide layer, bonding the donor semiconductor wafer to the base semiconductor wafer so that the superlattice layer is adjacent the oxide layer, removing portions of the donor wafer at the separation layer from the donor wafer to define an active semiconductor layer above the superlattice layer, and forming an electronic device(s) in the active layer.

16 Claims, 5 Drawing Sheets

(51) Int. Cl.
*H10D 86/00* (2025.01)
*H10W 10/10* (2026.01)

(56) References Cited

U.S. PATENT DOCUMENTS

| | | | | |
|---|---|---|---|---|
| 5,357,119 | A | 10/1994 | Wang et al. | |
| 5,374,564 | A | 12/1994 | Bruel | |
| 5,683,934 | A | 11/1997 | Candelaria | |
| 5,796,119 | A | 8/1998 | Seabaugh | |
| 6,362,076 | B1 | 3/2002 | Inazuki et al. | |
| 6,376,337 | B1 | 4/2002 | Wang et al. | |
| 6,447,933 | B1 | 9/2002 | Wang et al. | |
| 6,472,685 | B2 | 10/2002 | Takagi | |
| 6,741,624 | B2 | 5/2004 | Mears et al. | |
| 6,830,964 | B1 | 12/2004 | Mears et al. | |
| 6,833,294 | B1 | 12/2004 | Mears et al. | |
| 6,878,576 | B1 | 4/2005 | Mears et al. | |
| 6,891,188 | B2 | 5/2005 | Mears et al. | |
| 6,897,472 | B2 | 5/2005 | Mears et al. | |
| 6,927,413 | B2 | 8/2005 | Mears et al. | |
| 6,952,018 | B2 | 10/2005 | Mears et al. | |
| 6,958,486 | B2 | 10/2005 | Mears et al. | |
| 6,993,222 | B2 | 1/2006 | Mears et al. | |
| 7,018,900 | B2 | 3/2006 | Kreps | |
| 7,033,437 | B2 | 4/2006 | Mears et al. | |
| 7,034,329 | B2 | 4/2006 | Mears et al. | |
| 7,045,377 | B2 | 5/2006 | Mears et al. | |
| 7,045,813 | B2 | 5/2006 | Mears et al. | |
| 7,071,119 | B2 | 7/2006 | Mears et al. | |
| 7,105,895 | B2 | 9/2006 | Wang et al. | |
| 7,109,052 | B2 | 9/2006 | Mears et al. | |
| 7,123,792 | B1 | 10/2006 | Mears et al. | |
| 7,148,712 | B1 | 12/2006 | Prey, Jr. et al. | |
| 7,153,763 | B2 | 12/2006 | Hytha et al. | |
| 7,202,494 | B2 | 4/2007 | Blanchard et al. | |
| 7,227,174 | B2 | 6/2007 | Mears et al. | |
| 7,229,902 | B2 | 6/2007 | Mears et al. | |
| 7,261,793 | B2 | 8/2007 | Chen et al. | |
| 7,265,002 | B2 | 9/2007 | Mears et al. | |
| 7,279,699 | B2 | 10/2007 | Mears et al. | |
| 7,279,701 | B2 | 10/2007 | Kreps | |
| 7,288,457 | B2 | 10/2007 | Kreps | |
| 7,303,948 | B2 | 12/2007 | Mears et al. | |
| 7,402,512 | B2 | 7/2008 | Derraa et al. | |
| 7,432,524 | B2 | 10/2008 | Mears et al. | |
| 7,435,988 | B2 | 10/2008 | Mears et al. | |
| 7,436,026 | B2 | 10/2008 | Kreps | |
| 7,446,002 | B2 | 11/2008 | Mears et al. | |
| 7,446,334 | B2 | 11/2008 | Mears et al. | |
| 7,491,587 | B2 | 2/2009 | Rao | |
| 7,514,328 | B2 | 4/2009 | Rao | |
| 7,517,702 | B2 | 4/2009 | Halilov et al. | |
| 7,531,828 | B2 | 5/2009 | Mears et al. | |
| 7,531,829 | B2 | 5/2009 | Blanchard | |
| 7,531,850 | B2 | 5/2009 | Blanchard | |
| 7,535,041 | B2 | 5/2009 | Blanchard | |
| 7,586,116 | B2 | 9/2009 | Kreps et al. | |
| 7,586,165 | B2 | 9/2009 | Blanchard | |
| 7,598,515 | B2 | 10/2009 | Mears et al. | |
| 7,612,366 | B2 | 11/2009 | Mears et al. | |
| 7,615,464 | B2 | 11/2009 | Kerdiles et al. | |
| 7,625,767 | B2 | 12/2009 | Huang et al. | |
| 7,659,539 | B2 | 2/2010 | Kreps et al. | |
| 7,700,447 | B2 | 4/2010 | Dukovski et al. | |
| 7,718,996 | B2 | 5/2010 | Dukovski et al. | |
| 7,781,827 | B2 | 8/2010 | Rao | |
| 7,812,339 | B2 | 10/2010 | Mears et al. | |
| 7,863,066 | B2 | 1/2011 | Mears et al. | |
| 7,880,161 | B2 | 2/2011 | Mears et al. | |
| 7,928,425 | B2 * | 4/2011 | Rao ...................... | H10D 62/822 257/E21.085 |
| 7,972,939 | B2 | 7/2011 | Kerdiles et al. | |
| 8,389,974 | B2 | 3/2013 | Mears et al. | |
| 9,275,996 | B2 | 3/2016 | Mears et al. | |
| 9,406,753 | B2 | 8/2016 | Mears et al. | |
| 9,558,939 | B1 | 1/2017 | Stephenson et al. | |
| 9,716,147 | B2 | 7/2017 | Mears | |
| 9,721,790 | B2 | 8/2017 | Mears et al. | |
| 9,722,046 | B2 | 8/2017 | Mears et al. | |
| 9,899,479 | B2 | 2/2018 | Mears et al. | |
| 9,941,359 | B2 | 4/2018 | Mears et al. | |
| 9,972,685 | B2 | 5/2018 | Mears et al. | |
| 10,084,045 | B2 | 9/2018 | Mears et al. | |
| 10,107,854 | B2 | 10/2018 | Roy | |
| 10,109,342 | B2 | 10/2018 | Roy | |
| 10,109,479 | B1 | 10/2018 | Mears et al. | |
| 10,170,560 | B2 | 1/2019 | Mears | |
| 10,170,603 | B2 | 1/2019 | Mears et al. | |
| 10,170,604 | B2 | 1/2019 | Mears et al. | |
| 10,191,105 | B2 | 1/2019 | Roy | |
| 10,249,745 | B2 | 4/2019 | Mears et al. | |
| 10,276,625 | B1 | 4/2019 | Mears et al. | |
| 10,283,401 | B2 | 5/2019 | Ishikawa et al. | |
| 10,304,881 | B1 | 5/2019 | Chen et al. | |
| 10,355,151 | B2 | 7/2019 | Chen et al. | |
| 10,361,243 | B2 | 7/2019 | Mears et al. | |
| 10,367,028 | B2 | 7/2019 | Chen et al. | |
| 10,367,064 | B2 | 7/2019 | Rao | |
| 10,381,242 | B2 | 8/2019 | Takeuchi | |
| 10,396,223 | B2 | 8/2019 | Chen et al. | |
| 10,410,880 | B2 | 9/2019 | Takeuchi | |
| 10,453,945 | B2 | 10/2019 | Mears et al. | |
| 10,461,118 | B2 | 10/2019 | Chen et al. | |
| 10,468,245 | B2 | 11/2019 | Weeks et al. | |
| 10,529,757 | B2 | 1/2020 | Chen et al. | |
| 10,529,768 | B2 | 1/2020 | Chen et al. | |
| 10,566,191 | B1 | 2/2020 | Weeks et al. | |
| 10,566,196 | B2 | 2/2020 | Kobayashi et al. | |
| 10,580,866 | B1 | 3/2020 | Takeuchi et al. | |
| 10,580,867 | B1 | 3/2020 | Takeuchi et al. | |
| 10,593,761 | B1 | 3/2020 | Takeuchi et al. | |
| 10,608,027 | B2 | 3/2020 | Chen et al. | |
| 10,608,043 | B2 | 3/2020 | Chen et al. | |
| 10,615,209 | B2 | 4/2020 | Chen et al. | |
| 10,636,879 | B2 | 4/2020 | Rao | |
| 10,727,049 | B2 | 7/2020 | Weeks et al. | |
| 10,741,436 | B2 | 8/2020 | Stephenson et al. | |
| 10,763,370 | B2 | 9/2020 | Stephenson | |
| 10,777,451 | B2 | 9/2020 | Stephenson et al. | |
| 10,811,498 | B2 | 10/2020 | Weeks et al. | |
| 10,818,755 | B2 | 10/2020 | Takeuchi et al. | |
| 10,825,901 | B1 | 11/2020 | Burton et al. | |
| 10,825,902 | B1 | 11/2020 | Burton et al. | |
| 10,840,335 | B2 | 11/2020 | Takeuchi et al. | |
| 10,840,336 | B2 | 11/2020 | Connelly et al. | |
| 10,840,337 | B2 | 11/2020 | Takeuchi et al. | |
| 10,840,388 | B1 | 11/2020 | Burton et al. | |
| 10,847,618 | B2 | 11/2020 | Takeuchi et al. | |
| 10,854,717 | B2 | 12/2020 | Takeuchi et al. | |
| 10,868,120 | B1 | 12/2020 | Burton et al. | |
| 10,879,356 | B2 | 12/2020 | Stephenson et al. | |
| 10,879,357 | B1 | 12/2020 | Burton et al. | |
| 10,884,185 | B2 | 1/2021 | Stephenson | |
| 10,937,868 | B2 | 3/2021 | Burton et al. | |
| 10,937,888 | B2 | 3/2021 | Burton et al. | |
| 11,075,078 | B1 | 7/2021 | Cody et al. | |
| 11,094,818 | B2 | 8/2021 | Takeuchi et al. | |
| 11,177,351 | B2 | 11/2021 | Weeks et al. | |
| 11,183,565 | B2 | 11/2021 | Burton et al. | |
| 11,302,823 | B2 | 4/2022 | Weeks et al. | |
| 11,329,154 | B2 | 5/2022 | Takeuchi et al. | |
| 11,355,667 | B2 | 6/2022 | Stephenson | |
| 11,362,182 | B2 | 6/2022 | Shin et al. | |
| 11,387,325 | B2 | 7/2022 | Stephenson et al. | |
| 11,430,869 | B2 | 8/2022 | Weeks et al. | |
| 11,437,486 | B2 | 9/2022 | Burton | |
| 11,437,487 | B2 | 9/2022 | Burton | |
| 11,469,302 | B2 | 10/2022 | Takeuchi et al. | |
| 11,569,368 | B2 | 1/2023 | Takeuchi et al. | |
| 11,631,584 | B1 | 4/2023 | Hytha et al. | |
| 11,664,427 | B2 | 5/2023 | Stephenson et al. | |
| 11,664,459 | B2 | 5/2023 | Stephenson | |
| 11,682,712 | B2 | 6/2023 | Hytha et al. | |
| 11,721,546 | B2 | 8/2023 | Hytha et al. | |

(56) References Cited

U.S. PATENT DOCUMENTS

| | | | | |
|---|---|---|---|---|
| 11,728,385 | B2 | 8/2023 | Hytha et al. | |
| 11,742,202 | B2 | 8/2023 | Takeuchi et al. | |
| 11,810,784 | B2 | 11/2023 | Hytha et al. | |
| 11,837,634 | B2 | 12/2023 | Weeks et al. | |
| 11,848,356 | B2 | 12/2023 | Weeks et al. | |
| 11,869,968 | B2 | 1/2024 | Takeuchi et al. | |
| 11,923,418 | B2 | 3/2024 | Hytha et al. | |
| 11,923,431 | B2 | 3/2024 | Burton | |
| 11,935,940 | B2 | 3/2024 | Burton | |
| 2003/0034529 | A1 | 2/2003 | Fitzgerald et al. | |
| 2003/0057416 | A1 | 3/2003 | Currie et al. | |
| 2004/0262594 | A1 | 12/2004 | Mears et al. | |
| 2004/0266116 | A1 | 12/2004 | Mears | |
| 2005/0029510 | A1 | 2/2005 | Mears et al. | |
| 2005/0032241 | A1 | 2/2005 | Mears et al. | |
| 2005/0279991 | A1 | 12/2005 | Mears et al. | |
| 2005/0282330 | A1 | 12/2005 | Mears et al. | |
| 2006/0011905 | A1 | 1/2006 | Mears et al. | |
| 2006/0220118 | A1 | 10/2006 | Stephenson et al. | |
| 2006/0223215 | A1 | 10/2006 | Blanchard | |
| 2006/0231857 | A1 | 10/2006 | Blanchard | |
| 2006/0243964 | A1 | 11/2006 | Kreps et al. | |
| 2006/0261327 | A1* | 11/2006 | Kreps | H10D 30/0411 257/E29.302 |
| 2006/0263980 | A1 | 11/2006 | Kreps et al. | |
| 2006/0267130 | A1 | 11/2006 | Rao | |
| 2006/0273299 | A1 | 12/2006 | Stephenson et al. | |
| 2006/0289049 | A1* | 12/2006 | Rao | H10D 30/681 136/201 |
| 2006/0292765 | A1 | 12/2006 | Blanchard | |
| 2007/0010040 | A1 | 1/2007 | Mears et al. | |
| 2007/0012910 | A1 | 1/2007 | Mears et al. | |
| 2007/0015344 | A1 | 1/2007 | Mears et al. | |
| 2007/0020833 | A1 | 1/2007 | Mears et al. | |
| 2007/0020860 | A1 | 1/2007 | Mears et al. | |
| 2007/0063185 | A1 | 3/2007 | Rao | |
| 2007/0063186 | A1 | 3/2007 | Rao | |
| 2007/0158640 | A1 | 7/2007 | Stephenson et al. | |
| 2007/0161138 | A1 | 7/2007 | Halilov et al. | |
| 2007/0166928 | A1 | 7/2007 | Halilov et al. | |
| 2007/0187667 | A1 | 8/2007 | Halilov et al. | |
| 2008/0012004 | A1 | 1/2008 | Huang et al. | |
| 2008/0145650 | A1 | 6/2008 | Radu et al. | |
| 2009/0002589 | A1* | 1/2009 | Tanada | H01L 21/76254 257/E27.111 |
| 2010/0270535 | A1 | 10/2010 | Halilov et al. | |
| 2011/0108943 | A1* | 5/2011 | Dennard | H01L 21/84 257/E21.546 |
| 2011/0215299 | A1 | 9/2011 | Rao | |
| 2012/0329242 | A1 | 12/2012 | Hanaoka et al. | |
| 2015/0179505 | A1* | 6/2015 | Stuber | H01L 21/02178 438/459 |
| 2015/0303097 | A1 | 10/2015 | Konishi et al. | |
| 2018/0294182 | A1* | 10/2018 | Wang | H01L 21/02381 |
| 2019/0058059 | A1 | 2/2019 | Stephenson et al. | |
| 2020/0135489 | A1 | 4/2020 | Weeks et al. | |
| 2021/0082901 | A1* | 3/2021 | Gardner | H10P 10/12 |
| 2021/0126018 | A1 | 4/2021 | Zhang et al. | |
| 2021/0249301 | A1 | 8/2021 | Imai et al. | |
| 2021/0265509 | A1* | 8/2021 | Weeks | H10D 30/6748 |
| 2022/0005706 | A1 | 1/2022 | Weeks et al. | |
| 2022/0278204 | A1 | 9/2022 | Shin et al. | |
| 2022/0285152 | A1 | 9/2022 | Takeuchi et al. | |
| 2022/0344155 | A1* | 10/2022 | Hytha | H10P 14/3252 |
| 2022/0352322 | A1 | 11/2022 | Hytha et al. | |
| 2022/0367676 | A1 | 11/2022 | Burton | |
| 2022/0376047 | A1 | 11/2022 | Mears et al. | |
| 2022/0384600 | A1 | 12/2022 | Mears et al. | |
| 2023/0121774 | A1 | 4/2023 | Weeks et al. | |
| 2023/0122723 | A1 | 4/2023 | Weeks et al. | |
| 2023/0317873 | A1* | 10/2023 | Cheng | H10H 20/018 438/22 |
| 2023/0352299 | A1 | 11/2023 | Takeuchi et al. | |
| 2023/0361178 | A1 | 11/2023 | Hytha et al. | |
| 2023/0395374 | A1 | 12/2023 | Hytha et al. | |
| 2023/0411491 | A1 | 12/2023 | Hytha et al. | |
| 2023/0411557 | A1 | 12/2023 | Hytha et al. | |
| 2024/0063268 | A1 | 2/2024 | Weeks et al. | |
| 2024/0072095 | A1 | 2/2024 | Takeuchi et al. | |
| 2024/0072096 | A1 | 2/2024 | Takeuchi et al. | |

OTHER PUBLICATIONS

R. Tsu "Phenomena in silicon nanostructure device" published online Sep. 6, 2000 by Applied Physics and Materials Science & Processing, pp. 391-402.

Xu et al., "MOSFET performance and scalability enhancement by insertion of oxygen layers", Department of Electrical Engineering and Computer Science, University of California, Berkeley, 2012, pp. 1-4.

Luo et al., "Chemical Design of Direct-Gap Light-Emitting Silicon" published in Physical Review Letters, vol. 89, No. 7; Aug. 12, 2002; 4 pgs.

R. Tsu "Si Based Green ELD: Si-Oxygen Superlattice" ysiwyg://1/http://www3.interscience.wiley.com/cgi-bin/abstract/72512946/start: published online Jul. 21, 2000; 2 pgs. Abstract Only.

Novikov et al. "Silicon-based Optoelectronics" 1999-2003, pp. 1-6.

Mears et al. "Simultaneous Carrier Transport Enhancement and variability reduction in Si MOSFETs by insertion of partial Monolayers of oxygen" IEEE silicon Nanoelectronics Workshop (2012): (Date of conference Jun. 10-11, 2012) pp. 2.

Xu et al. "Extension of planar bulk n-channel MOSFET scaling with oxygen insertion technology" IEEE Transactions on Electron devices, vol. 61, No. 9; Sep. 2014. pp. 3345-3349.

Xu et al. "Effectiveness of Quasi-confinement technology for improving P-chanel Si an Ge MOSSFET performance" Department of Electrical Engineering and Computer Science, University of California, Berkeley, 2012, pp. 2. mearstech.net; retrieved from internet Jan. 18, 2016.

Maurizio Di Paolo Emilio "Quantum-Engineered Material Boosts Transistor Performance" https://www.eetimes. com/quantum-engineered-material-boosts-transistor-performance/# EE Times; retreived from internet Feb. 10, 2022; pp. 3.

Sun et al. "Selective Enhancement of SiO2 Etch Rate by Ar-Ion Implantation for Improved Etch Depth Control" Electrochemical and Solid-State Letters, 10 (9) 1-XXXXX (2007) pp. 4.

Christiansen et al. "Wafer Direct Bonding: From AdvancedSubstrateEngineering to Future Applications in Micro/Nanoelectronics" Proceedings of the IEEE; vol. 94,No. 12, Dec. 2006; pp. 2600-2106.

Widiez et al. "SOI-type bonded structures for advanced technology nodes" ECS Transactions • Aug. 2014; pp. 15.

* cited by examiner

60

| PROCESS | EXAMPLE | RANGE |
|---|---|---|
| Epi THICKNESS(nm) | 20 | 10-50 |
| H+ DOSE(/cm2) | 6.00E+16 | 5E16-2E17 |
| H+ ENERGY(keV) | 42.5 | 36-49 |
| H+ DEPTH(nm) | 400 | 350-450 |
| DAMAGE INTRODUCTION IMPLANTATION | Ar+ 10keV 1.00E+14/cm$^2$ | Ar+ 7-12keV 5E13-5E14/cm2 |
| | He, Ne, Kr, Xe CAN BE USED. IMPLANT ENERGY NEEDS TO BE ADJUSTED TO ACHIEVE SIMILAR IMPLANT PROJECTION RANGE TAKING THEIR MASS CHANGE FROM Ar INTO ACCOUNT | |
| STABILIZATION(DgreeC) IN Ar | 800°C<br>30MIN | 700-900°C<br>30-60MIN |
| SMOOTHING(dgreeC) IN H2 | 900°C<br>100SEC<br>40Torr | 850-1000°C<br>30-120SEC<br>10-760Torr |
| BOX LAYER(CVD Depo)(nm) | 400-1000 | 200-1500 |

FIG. 5

METHOD FOR MAKING RADIO FREQUENCY SILICON-ON-INSULATOR (RFSOI) STRUCTURE INCLUDING A SUPERLATTICE

RELATED APPLICATIONS

This application claims the benefit of U.S. provisional application Ser. No. 63/489,442 filed Mar. 10, 2023 and application Ser. No. 63/512,130 filed Jul. 6, 2023, which are hereby incorporated herein in their entirety by reference.

TECHNICAL FIELD

The present disclosure generally relates to semiconductor devices, and, more particularly, to integrated radio frequency (RF) devices and related methods.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of $SiO_2$/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

U.S. Pat. No. 7,105,895 to Wang et al. discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Furthermore, U.S. Pat. No. 6,376,337 to Wang et al. discloses a method for producing an insulating or barrier layer for semiconductor devices which includes depositing a layer of silicon and at least one additional element on the silicon substrate whereby the deposited layer is substantially free of defects such that epitaxial silicon substantially free of defects can be deposited on the deposited layer. Alternatively, a monolayer of one or more elements, preferably comprising oxygen, is absorbed on a silicon substrate. A plurality of insulating layers sandwiched between epitaxial silicon forms a barrier composite.

Despite the existence of such approaches, further enhancements may be desirable for using advanced semiconductor materials and processing techniques to achieve improved performance in semiconductor devices.

SUMMARY

A semiconductor processing method may include forming a superlattice layer on a donor semiconductor wafer, with the superlattice including a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions. The method may further include performing ion implantation on the donor semiconductor wafer to create a separation layer below the superlattice layer, forming an oxide layer on a base semiconductor wafer, performing an ion beam treatment on the oxide layer, bonding the donor semiconductor wafer to the base semiconductor wafer so that the superlattice layer is adjacent the oxide layer, and removing portions of the donor wafer at the separation layer from the donor wafer to define an active semiconductor layer above the superlattice layer. The method may also include forming at least one electronic device in the active semiconductor layer.

In an example embodiment, the active semiconductor layer may have a thickness of less than 10 nm. By way of example, the ion implantation on the donor semiconductor wafer may comprise hydrogen ion implantation. Also by way of example, the ion beam treatment on the oxide layer may comprise an argon ion beam treatment. In some embodiments, the method may further include performing a heat treatment after removing portions of the donor wafer at the separation layer.

In accordance with an example implementation, the method may further include performing a surface smoothing on the active semiconductor layer after removing portions of the donor wafer at the separation layer. By way of example, the ion implantation on the donor semiconductor wafer may be performed at a dosage in a range of $5\times10^{16}/cm^2$ to $2\times10^{17}/cm^2$, and at an accelerating voltage in a range of 36-49 keV. Also by way of example, the ion beam treatment on the oxide layer may be performed at a dosage in a range of $5\times10^{13}/cm^2$ to $5\times10^{14}/cm^2$, and at an accelerating voltage in a range of 7-12 keV.

A related semiconductor device may include a base semiconductor wafer, an oxide layer on the base semiconductor wafer, and a first epitaxial semiconductor layer on the oxide layer having a thickness of less than 5 nm. The semiconductor device may also include a superlattice layer on the first epitaxial semiconductor layer, such as the superlattice layer described briefly above. The semiconductor devices may further include a second epitaxial semiconductor layer above the superlattice layer, and at least one electronic device the in second epitaxial semiconductor layer.

BRIEF DESCRIPTION OF THE DRAWINGS

FIG. 5 is a table providing example processing parameters which may be used with the method illustrated in FIG. 5.

DETAILED DESCRIPTION

Figure 1:
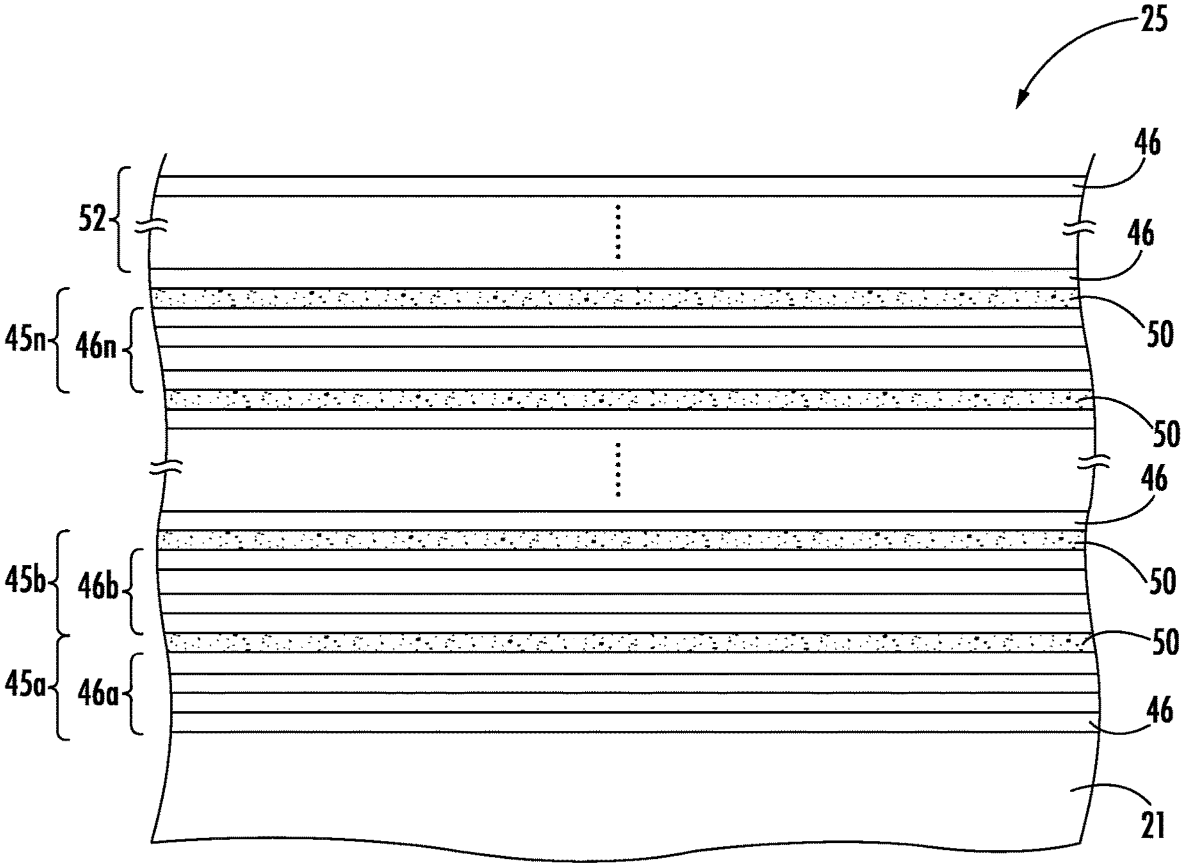
FIG. 1 is a greatly enlarged schematic cross-sectional view of a superlattice for use in a semiconductor device in accordance with an example embodiment.

Example embodiments will now be described more fully hereinafter with reference to the accompanying drawings, in which the example embodiments are shown. The embodiments may, however, be implemented in many different forms and should not be construed as limited to the specific examples set forth herein. Rather, these embodiments are provided so that this disclosure will be thorough and complete. Like numbers refer to like elements throughout.

Generally speaking, the present disclosure relates to semiconductor devices having an enhanced semiconductor superlattice therein to provide performance enhancement characteristics. The enhanced semiconductor superlattice may also be referred to as an "MST" layer or "MST technology" in this disclosure.

More particularly, the MST technology relates to advanced semiconductor materials such as the superlattice 25 described further below. In prior work, Applicant theorized that certain superlattices as described herein reduce the effective mass of charge carriers and that this thereby leads to higher charge carrier mobility. See, e.g., U.S. Pat. No. 6,897,472, which is hereby incorporate herein in its entirety by reference.

Further development by Applicant has established that the presence of MST layers may advantageously improve the mobility of free carriers in semiconductor materials, e.g., at interfaces between silicon and insulators like $SiO_2$ or $HfO_2$. Applicant theorizes, without wishing to be bound thereto, that this may occur due to various mechanisms. One mechanism is by reducing the concentration of charged impurities proximate to the interface, by reducing the diffusion of these impurities, and/or by trapping the impurities so they do not reach the interface proximity. Charged impurities cause Coulomb scattering, which reduces mobility. Another mechanism is by improving the quality of the interface. For example, oxygen emitted from an MST film may provide oxygen to a Si—$SiO_2$ interface, reducing the presence of sub-stochastic $SiO_x$. Alternately, the trapping of interstitials by MST layers may reduce the concentration of interstitial silicon proximate to the Si—$SiO_2$ interface, reducing the tendency to form sub-stochastic $SiO_2$. Sub-stochastic $SiO_x$ at the Si—$SiO_2$ interface is known to exhibit inferior insulating properties relative to stochastic $SiO_2$. Reducing the amount of sub-stochastic $SiO_x$ at the interface more effectively confines free carriers (electrons or holes) in the silicon, and thus improves the mobility of these carriers due to electric fields applied parallel to the interface, as is standard practice in field-effect-transistor ("FET") structures. Scattering due to the direct influence of the interface is called "surface-roughness scattering", which may advantageously be reduced by the proximity of MST layers followed by anneals or during thermal oxidation.

In addition to the enhanced mobility characteristics of MST structures, they may also be formed or used in such a manner that they provide piezoelectric, pyroelectric, and/or ferroelectric properties that are advantageous for use in a variety of different types of devices, as will be discussed further below.

Figure 2:
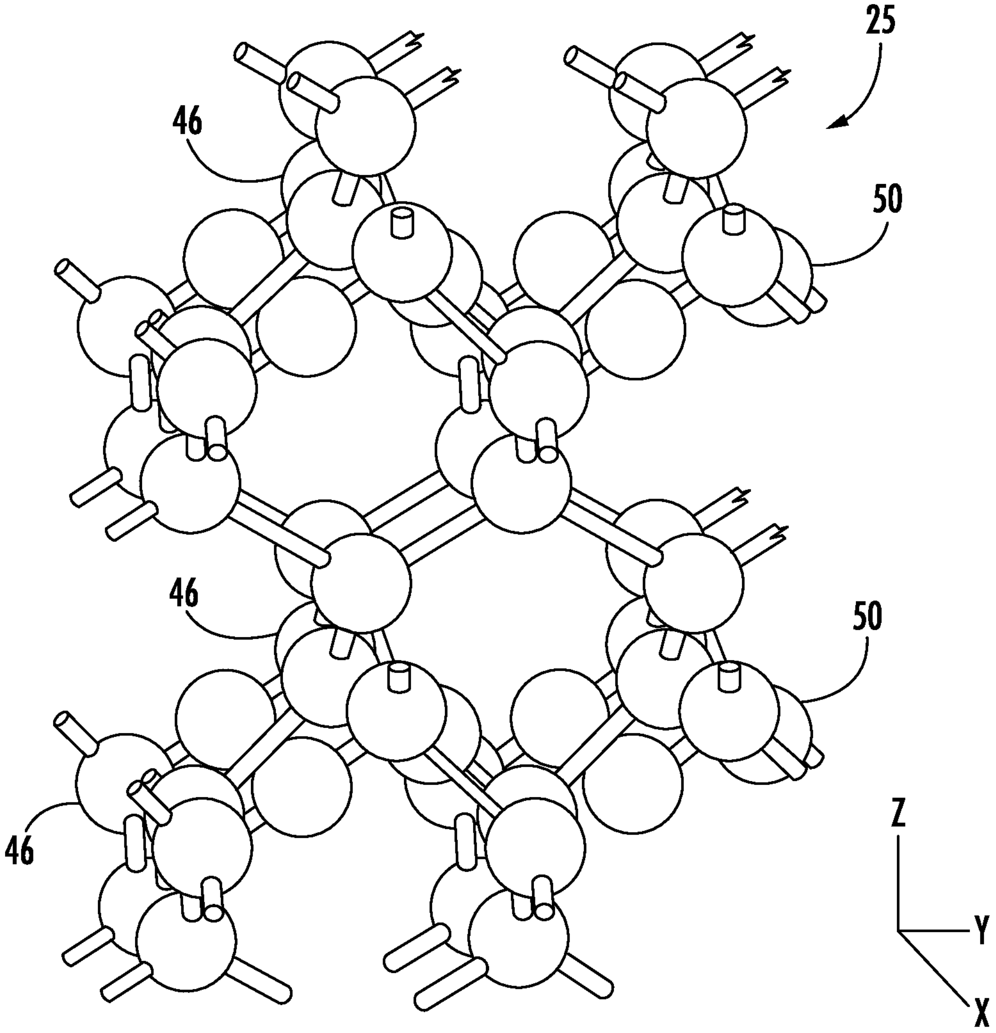
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45*a*-45*n* arranged in stacked relation, as perhaps best understood with specific reference to the schematic cross-sectional view of FIG. 1.

Each group of layers 45*a*-45*n* of the superlattice 25 illustratively includes a plurality of stacked base semiconductor monolayers 46 defining a respective base semiconductor portion 46*a*-46*n* and a non-semiconductor monolayer(s) 50 thereon. The non-semiconductor monolayers 50 are indicated by stippling in FIG. 1 for clarity of illustration.

The non-semiconductor monolayer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46*a*-46*n* are chemically bound together through the non-semiconductor monolayer 50 therebetween, as seen in FIG. 2. Generally speaking, this configuration is made possible by controlling the amount of non-semiconductor material that is deposited on semiconductor portions 46*a*-46*n* through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicant theorizes without wishing to be bound thereto that non-semiconductor monolayers 50 and adjacent base semiconductor portions 46*a*-46*n* cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45*n*. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46*a*-46*n* may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each non-semiconductor monolayer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example It should be noted that the term monolayer is meant to include a single atomic layer and also a single molecular layer. It is also noted that the non-semiconductor monolayer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

Figure 3:
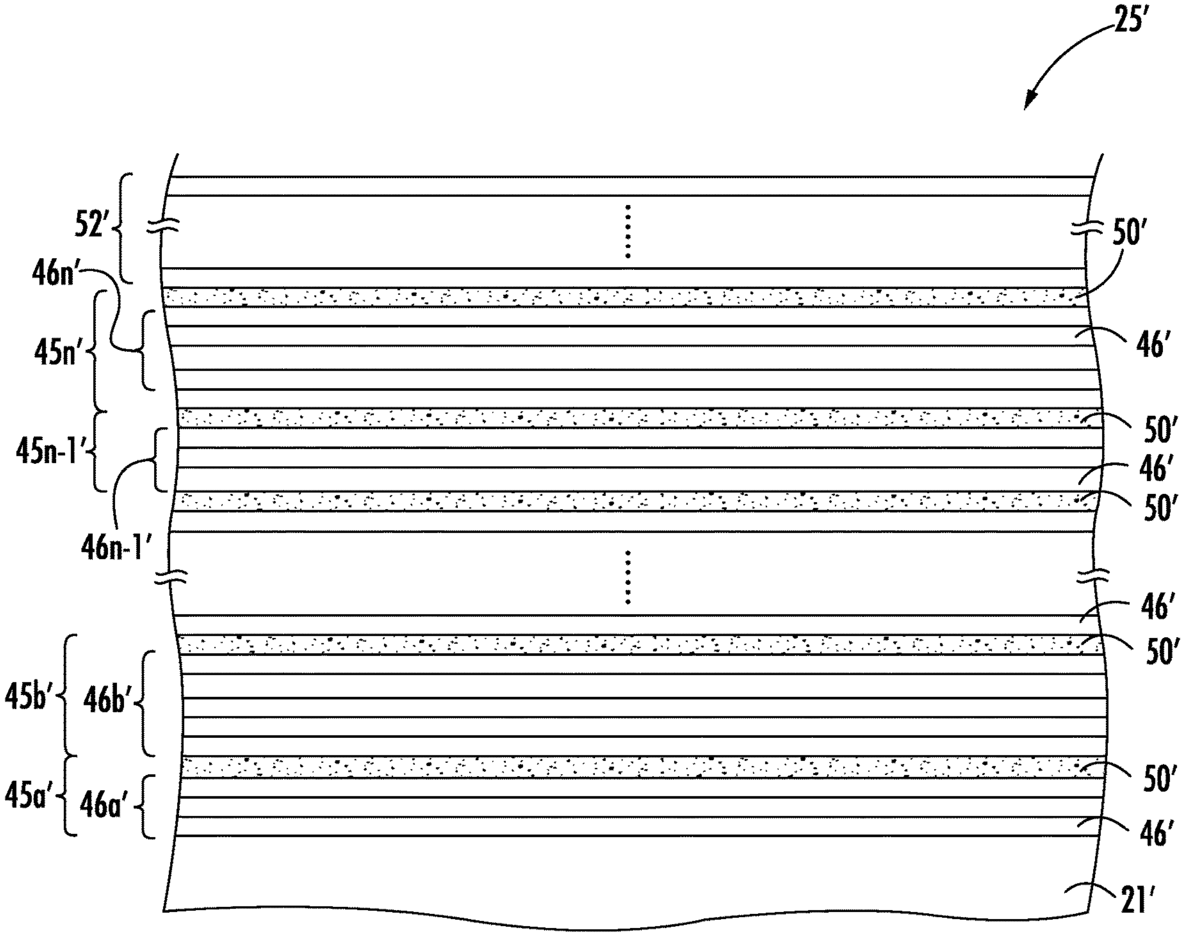
FIG. 3 is a greatly enlarged schematic cross-sectional view of another embodiment of a superlattice in accordance with an example embodiment.

Referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46*a'* has three monolayers, and the second lowest base semiconductor portion 46*b'* has five monolayers. This pattern repeats throughout the superlattice 25'. The non-semiconductor monolayers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4:
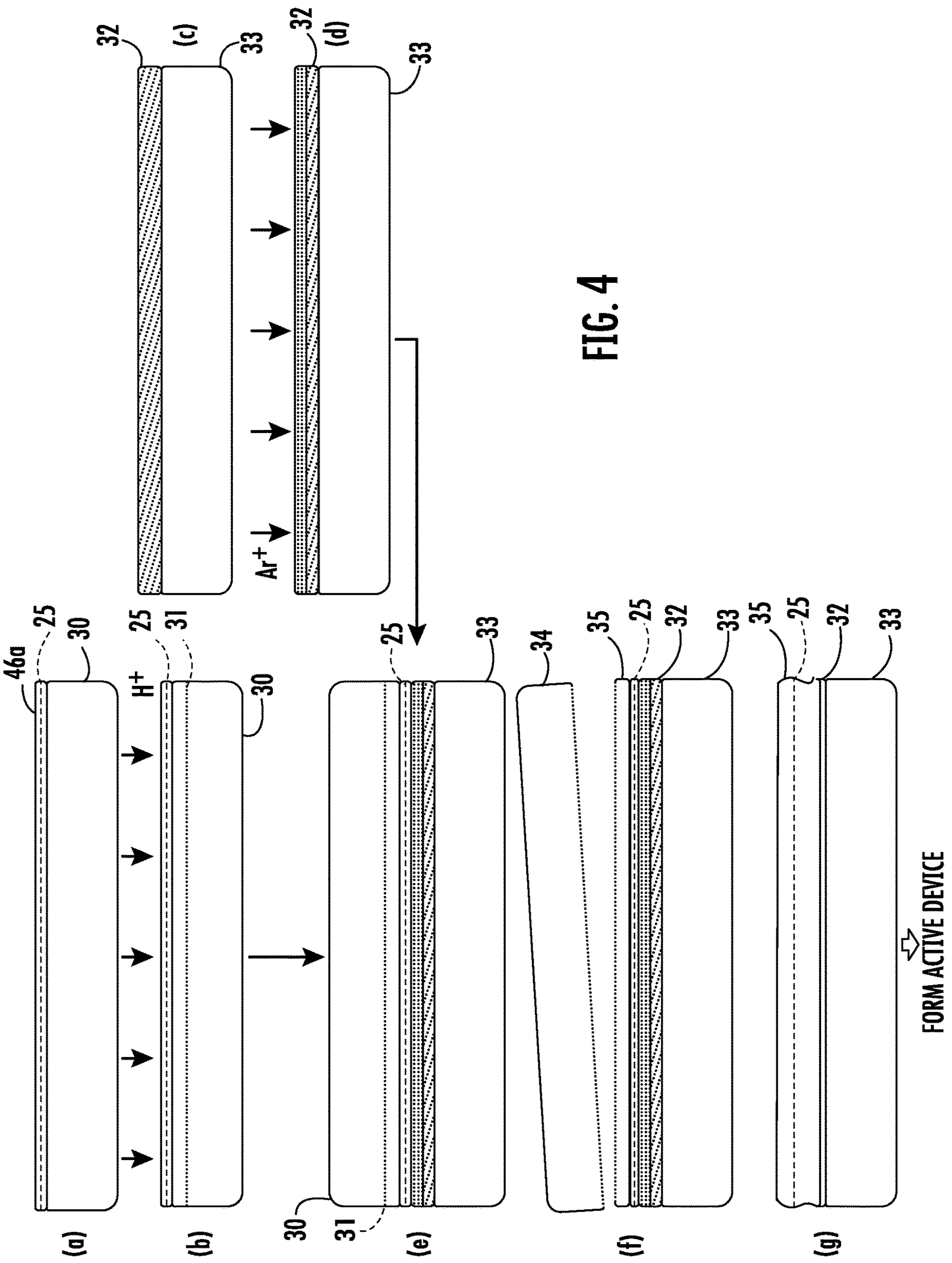
FIG. 4 is a series of schematic cross-sectional diagrams illustrating a method of making an RFSOI wafer using a superlattice in accordance with an example embodiment.

Turning now to FIGS. 4 and 5, an example wafer-bonding approach for semiconductor-on-insulator (SOI) wafer formation, upon which the above-described MST films may be fabricated, is now described. By way of background, implementation of an MST layer near an SOI/buried oxide (BOX) interface of a radio frequency SOI (RFSOI) substrate is effective in performance improvement of RFSOI devices due to improved boron retention in the MST layer. The distance between the BOX and MST layer is generally desired to be as thin as possible. To locate an MST layer near the SOI/BOX when using conventional SOI wafers, the upper silicon layer of the conventional SOI wafer needs to be thinned down before epitaxial growth of the MST layer and subsequent Si cap layer. The distance between the MST layer and BOX in this scenario is restricted to ~10 nm due to uniformity control of SOI thinning processes.

To avoid such restrictions, it may be desirable to implement MST layer formation on a donor wafer of an SOI wafer fabrication process where a Si thickness of less than 10 nm may be used. However, typical SOI wafer fabrication processing requires high-temperature furnace annealing above 950° C. This is because the anneal temperature and time need to be high and long enough for an $SiO_2$ layer to be fluidized to ensure mechanical strength of the bonding interface. However, such high temperatures at the requisite durations decompose MST films into regular (bulk) Si.

For lower temperature wafer bonding processes, plasma treatment of a donor Si wafer or handle Si wafer has been proposed to enhance low-temperature viscosity of the surface $SiO_2$ layer by introducing plasma damage to the $SiO_2$ surface. However, this method gives only surface thin layer fluidization. Surface fluidization of BOX $SiO_2$ during a bonding interface stabilization sets the lower limit of the thermal budget for the SOI fabrication process, which limits applicable donor materials to fabricate SOI substrates by a smart cut method.

The present approach provides a method which overcomes the above-noted technical problems. The process begins with epitaxially growing an MST film 25 on a donor semiconductor wafer 30 (e.g., single crystal silicon), as discussed further above (step (a) in FIG. 4). An ion implantation is then performed, e.g., hydrogen ion implantation, at an appropriate accelerating voltage (e.g., 36-49 keV, and in one example embodiment 42.5 keV) and dose (e.g., $5\times10^{16}$-$2\times10^{17}$, and in one example embodiment $6\times10^{16}$), as shown in the table 60 of FIG. 5. The ion implantation on the donor semiconductor wafer 30 creates a separation layer 31 below the superlattice layer 25 (step (b) in FIG. 4). By way of example, the separation layer 31 may be at a depth of between 350 nm and 450 nm below the superlattice 25, and at about 400 nm in one example embodiment.

Furthermore, an oxide layer 32 is formed on a base semiconductor wafer 33 (e.g., $SiO_2$ on a silicon wafer), as seen at step (c) of FIG. 4. An ion beam treatment is then performed on the oxide layer 32 (step (d) of FIG. 4) to make the oxide layer liquefy and to enable low temperature bonding. By way of example, an Ar ion beam treatment may be used at an accelerating voltage in a range of 7-12 keV and at a dosage of $5\times10^{13}$-$5\times10^{14}/cm^2$, and in one example embodiment at about 10 keV at a dosage of $1\times10^{14}$ $cm^2$ (see FIG. 5) Other sources which may be used for the ion beam treatment in different embodiments may include He, Ne, Kr, and Xe, for example, with implant energies adjusted to achieve a similar implant projection range taking their mass change from Ar into account, as will be appreciated by those skilled in the art.

The Ar ion beam treatment (or other suitable plasma treatments, as noted above) advantageously provides a bonding interface having enough strength that a sufficient thickness of an SiOx layer 32 may be formed which relatively easily flows the oxide film at a low temperature. As a result, an SOI substrate with an MST layer 25 having a bonding interface may be achieved at a low temperature which does not compromise the integrity of the MST layer. More particularly, use of the Ar ion beam treatment for a buried oxide surface on the handling wafer 33 enables low temperature bonding of donor wafers with MST films (also known as OI or oxygen-inserted layers) on the surface to maximize RF switch performance. This low-temperature processing is effective not only for MST donor wafers, but also for other materials which have such thermal constraints.

The donor wafer 31 may then be bonded to the base semiconductor wafer 33 so that the superlattice layer 25 is adjacent the oxide layer 32 (step (e) of FIG. 4). Portions 34 of the donor wafer 31 above the separation layer 31 may then be separated from the donor wafer 33 by a "smart-cut" approach to define an active semiconductor layer 35 above the superlattice layer 25, as seen in steps (f)-(g) of FIG. 4. The active semiconductor layer 35 may then be subjected to an interface stabilization heat treatment and surface smoothing treatment, if desired. Further processing may then be performed to form electronic devices (e.g., planar FETs, FINFETS, etc.) in the active semiconductor layer 35. Examples of such devices are set forth in U.S. Pat. Nos. 7,202,494; 10,580,867; and 10,608,043, for example, which are all assigned to the present Assignee and hereby incorporated herein in their entireties by reference.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The invention claimed is:

1. A semiconductor processing method comprising:

forming a superlattice layer on a donor semiconductor wafer, the superlattice layer comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions, wherein not all available semiconductor bonding sites are populated with bonds to non-semiconductor atoms so that at least some semiconductor atoms from opposing base semiconductor portions are chemically bound together through the non-semiconductor monolayer therebetween;

performing ion implantation on the donor semiconductor wafer to create a separation layer below the superlattice layer;

forming an oxide layer on a base semiconductor wafer;

performing an ion beam treatment on the oxide layer to liquefy the oxide layer and enable bonding of the donor semiconductor wafer to the base semiconductor wafer at a temperature that does not decompose the superlattice layer;

bonding the donor semiconductor wafer to the base semiconductor wafer so that the superlattice layer is spaced apart from the oxide layer by a thickness of semiconductor material, the thickness of semiconductor material being less than 10 nm;

removing portions of the donor wafer at the separation layer from the donor wafer to define an active semiconductor layer above the superlattice layer; and forming at least one electronic device in the active semiconductor layer.

2. The method of claim 1 wherein the thickness of semiconductor material is less than 5 nm.

3. The method of claim 1 wherein the ion implantation comprises hydrogen ion implantation.

4. The method of claim 1 wherein the ion beam treatment comprises an argon ion beam treatment.

5. The method of claim 1 further comprising performing a heat treatment after removing portions of the donor wafer at the separation layer.

6. The method of claim 1 further comprising performing a surface smoothing on the active semiconductor layer after removing portions of the donor wafer at the separation layer.

7. The method of claim 1 wherein the ion implantation is performed at a dosage in a range of $5\times10^{16}/cm^2$ to $2\times10^{17}/cm^2$.

8. The method of claim 1 wherein the ion implantation is performed at an accelerating voltage in a range of 36-49 keV.

9. The method of claim 1 wherein the ion beam treatment is performed at a dosage in a range of $5\times10^{13}/cm^2$ to $5\times10^{14}/cm^2$.

10. The method of claim 1 wherein the ion beam treatment is performed at an accelerating voltage in a range of 7-12 keV.

11. A semiconductor processing method comprising:

forming a superlattice layer on a donor semiconductor wafer, the superlattice layer comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions, wherein not all available semiconductor bonding sites are populated with bonds to non-semiconductor atoms so that at least some semiconductor atoms from opposing base semiconductor portions are chemically bound together through the non-semiconductor monolayer therebetween;

performing ion implantation on the donor semiconductor wafer to create a separation layer below the superlattice layer;

forming an oxide layer on a base semiconductor wafer;

performing an ion beam treatment on the oxide layer to liquefy the oxide layer and enable bonding of the donor semiconductor wafer to the base semiconductor wafer at a temperature that does not decompose the superlattice layer;

bonding the donor semiconductor wafer to the base semiconductor wafer so that the superlattice layer is spaced apart from the oxide layer by a thickness of semiconductor material, the thickness of semiconductor material being less than 10 nm;

removing portions of the donor wafer at the separation layer from the donor wafer to define an active semiconductor layer above the superlattice layer;

performing a surface smoothing on the active semiconductor layer and a heat treatment after removing portions of the donor wafer at the separation layer; and forming at least one electronic device in the active semiconductor layer.

12. The method of claim 11 wherein the thickness of semiconductor material is less than 5 nm.

13. The method of claim 11 wherein the ion implantation comprises hydrogen ion implantation.

14. The method of claim 11 wherein the ion beam treatment comprises an argon ion beam treatment.

15. The method of claim 11 wherein the ion implantation is performed at a dosage in a range of $5\times10^{16}/cm^2$ to $2\times10^{17}/cm^2$, and at an accelerating voltage in a range of 36-49 keV.

16. The method of claim 11 wherein the ion beam treatment is performed at a dosage in a range of $5\times10^{13}/cm^2$ to $5\times10^{14}/cm^2$, and at an accelerating voltage in a range of 7-12 keV.

* * * * *